(12) United States Patent
Stoppel

(10) Patent No.: US 8,262,146 B2
(45) Date of Patent: Sep. 11, 2012

(54) HANDLING TOOLS FOR COMPONENTS, IN PARTICULAR ELETRONIC COMPONENTS

(75) Inventor: Klaus Stoppel, Besigheim (DE)

(73) Assignee: Robert Bosch GmbH, Stuttgart (DE)

( * ) Notice: Subject to any disclaimer, the term of this patent is extended or adjusted under 35 U.S.C. 154(b) by 315 days.

(21) Appl. No.: 12/312,887

(22) PCT Filed: Dec. 4, 2007

(86) PCT No.: PCT/EP2007/063230
§ 371 (c)(1),
(2), (4) Date: Jan. 15, 2010

(87) PCT Pub. No.: WO2008/071590
PCT Pub. Date: Jun. 19, 2008

(65) Prior Publication Data
US 2010/0143088 A1    Jun. 10, 2010

(30) Foreign Application Priority Data
Dec. 11, 2006   (DE) .......................... 10 2006 058 299

(51) Int. Cl.
*B25J 15/06* (2006.01)
*H01L 21/683* (2006.01)

(52) U.S. Cl. ......................................... 294/183; 29/743

(58) Field of Classification Search .................. 294/183, 294/186, 189, 65, 64.1; 29/740, 741, 743; 156/581, 707; 414/627, 737, 752.1
See application file for complete search history.

(56) References Cited

U.S. PATENT DOCUMENTS

| | | | | |
|---|---|---|---|---|
| 2,163,441 A | * | 6/1939 | Von Hofe | 271/106 |
| 2,850,279 A | * | 9/1958 | Stoothoff et al. | 271/103 |
| 3,724,687 A | * | 4/1973 | Marschke et al. | 414/797 |
| 4,736,938 A | * | 4/1988 | Jiruse et al. | 271/90 |
| 4,797,994 A | | 1/1989 | Michaud et al. | |
| 4,990,051 A | * | 2/1991 | Safabakhsh et al. | 156/707 |
| 5,174,021 A | * | 12/1992 | L'Esperance et al. | 294/183 |
| 5,207,465 A | * | 5/1993 | Rich | 294/2 |
| 6,502,876 B1 | * | 1/2003 | Stockhorst et al. | 294/183 |
| 2006/0232085 A1 | * | 10/2006 | Nagasawa et al. | 294/64.1 |

FOREIGN PATENT DOCUMENTS

| | | |
|---|---|---|
| CN | 1399320 | 2/2003 |
| CN | 1427459 | 7/2003 |
| CN | 101558485 | 10/2009 |
| DE | 196 10 112 | 9/1997 |
| EP | 1 278 232 | 1/2003 |
| EP | 1 321 966 | 6/2003 |
| JP | 3-44583 | 2/1991 |
| JP | 5-169385 | * 7/1993 |
| JP | 6-39769 | * 2/1994 |
| JP | 2005-322815 | 11/2005 |

* cited by examiner

*Primary Examiner* — Paul T Chin
(74) *Attorney, Agent, or Firm* — Kenyon & Kenyon LLP

(57) ABSTRACT

A handling tool for electronic components includes a holding opening, to which a vacuum pressure may be applied and at which components to be handled are able to be held via vacuum pressure. At least one counter support, which outwardly projects beyond the opening plane in an operating position, is situated inside the holding opening. The component held by vacuum pressure is supported in the region of its surface acted upon by vacuum pressure, in such a way that this same surface bends concavely when viewed from the side of the vacuum pressure.

10 Claims, 3 Drawing Sheets

HANDLING TOOLS FOR COMPONENTS, IN PARTICULAR ELETRONIC COMPONENTS

BACKGROUND OF THE INVENTION

1. Field of the Invention

The present invention relates to a handling tool for components, e.g., electronic components.

2. Description of Related Art

Handling tools for components, in particular electronic components, are already known. They are used in assembly devices and die-bonding devices, for instance, and utilized to produce electronic circuits; the components are picked up by the handling tools, i.e., the pick-up and bonding devices, using vacuum pressure, in particular, placed on a circuit board by the handling tool and fixed in place there. The handling tools known from the related art are constructed such that they have a holding opening, to which vacuum pressure is applied so that the components when touched by the holding opening are retained in the holding opening by the vacuum pressure prevailing inside the handling tool in conjunction with the ambient air pressure. Depending on their thickness, i.e., especially their material strength and flexibility, the components are bent into the holding opening at the holding opening, so that a deformation/bending of the component into the holding opening occurs. On the side of the component to be fixed in place on the circuit board or the substrate, this deformation causes a cavity (concave shape) to form, which leads to shrink holes and gas inclusions in the placement. Especially when the component is placed on epoxide, solder or seal glass, irreversible errors arise in the process, which result in a high rejection rate or which, as a minimum, have an adverse effect on the quality of the bonding. Furthermore, if the component has only low material strength, the vacuum pressure can bend the component at the holding opening to such an extent that damage occurs.

BRIEF SUMMARY OF THE INVENTION

It is an object of the present invention to provide a handling tool for components, in particular electronic components, which avoids the mentioned disadvantages.

To this end, a handling tool for components, in particular electronic components, is provided, which has a holding opening to which vacuum pressure may be applied and at which the component to be handled is able to be held via vacuum pressure. It is provided that at least one counter support is situated inside the vacuum pressure opening, which outwardly projects beyond the opening plane in an operating position (an operating position is understood as a position of the handling tool in which the component to be handled is retained at the holding opening by vacuum pressure). In contrast to the related art, the holding opening is thus not completely open but has at least one counter support, which counteracts the deformation of the component in the direction of the vacuum pressure acting on it (i.e., into the holding opening) in an operating position. Moreover, it permits the (slight) deformation of the component in exactly the reverse direction, so that—when viewed from the placement level—it is not a concave but a convex form that comes about, i.e., the component thus is placed on the substrate not via its edge sides first, but via its midsection (which is pressed outwardly by the counter support, that is to say, toward the substrate). If the placement side is a planar bonding surface as is normally the case in the related art, a centrical surface mounting of the component takes place in the beginning, so that possible gases are pushed in an outward direction, toward the edges, once the handling tool sets down the component, instead of being retained in the center of the component by the edges that made contact first. The development of shrink holes because of surface inclusions in the placement on top of the bonding medium is avoided in this case. In addition, canting due to a non-parallel placement of the component is able to be prevented because the concave form compensates for an offset with respect to the substrate upon placement of the component.

In one further development, a sleeve having the holding opening is supported on the counter support in a manner allowing axial displacement. Depending on the material strength of the component to be picked up and its deformation by the application of vacuum pressure, the sleeve, which is axially displaceable counter to its weight force, is shifted axially toward the rear, so that the counter support projects a little further from the holding opening than in the idle state. The deformation of the component is solely dependent upon the material strength of the component and the magnitude of the vacuum pressure that is applied to the component at the holding opening. This produces sufficient deformation as well as a convex form with respect to the side of the component to be placed on the substrate. When the vacuum pressure is switched off in order to detach the component, the sleeve slides and projects beyond the counter support due to its weight, so that the component is removed from the counter support.

In one additional preferred development, the sleeve is supported in a manner allowing axial displacement counter to the spring force. Instead of its own weight, in this instance a defined spring force causes the resetting of the axial displacement, which spring force may also be designed to be adjustable via additional external means as known from the related art, such as via a thread by which the spring excursion is able to be regulated, thereby allowing the spring force action to be set in a highly precise manner.

In one additional, especially preferred development, the magnitude of the vacuum pressure is individually controllable by a control device, in particular as a function of the component. The vacuum pressure applied to the component at the vacuum pressure opening is able to be controlled/regulated in order to produce an advantageous desired deformation of the component at all times and, of course, to generate the holding force required for reliable and fault-free handling of the component. Especially components having low material strength, such as thin chips, for instance, require more of a slight vacuum pressure application since they weigh only very little on the one hand, i.e., the holding force is therefore achieved very quickly but, on the other hand, there is a not inconsiderable risk of breakage if they are deformed to an excessive extent. Components having high material strength require a higher application of vacuum pressure since they are not easily deformed as desired at the holding opening by the counter support and by the axially displaceable sleeve, so that the desired convex form is obtained. This specific development makes it possible to regulate the vacuum pressure depending on the component strength and nature in such a way that all components undergo substantially the same convex development on the side facing the substrate, and very reliable processing is possible in this regard, so that cavities in the placement and the shrink holes produced thereby are avoided.

In one preferred development, the counter support is traversed by at least one vacuum pressure supply channel. The application of vacuum pressure to the vacuum pressure opening thus is implemented via the counter support and not by other constructive measures. This offers the advantage that especially when an axially displaceable sleeve is provided, a largely sealed constructive development is possible, which is very easy to produce, in which the sleeve is simply placed on the counter support so as to be axially displaceable, and a spring force is applied to the sleeve at its end (not facing the opening plane) by a helical compression spring, for example. A very effective handling tool is therefore able to be produced using only a few components.

In another, especially preferred development, the counter support is centrically situated in the vacuum pressure opening. This development readily permits a precisely centered development of the convex deformation on the component. In the same way, the constructive implementation of the handling tool, e.g., in the form of an essentially cylindrical or rod-shaped counter support and a cylindrical sleeve, is very easy.

In one further especially preferred development, the counter support has a rounded tip, in particular a conical tip. The development with a rounded tip prevents damage or injuries to the surface of the component and allows for an even force application to the component by the counter support at the time of the vacuum pressure application and deformation.

In one especially preferred development, the rounded tip is designed as exchangeable counter-pressure tip. This makes it easy to adapt the geometry and material characteristics of the counter-pressure tip to the particular application fields and the requirements of the components to be processed. This is especially advantageous in cases where sensitive electronic components are processed and/or the handling tool processes frequently changing types of components having different compositions and sensitivities. The exchange of the counter-pressure tip can be undertaken manually by an operator or else automatically, preferably while providing a plurality of counter-pressure tips in a storage rack or a similar device.

Furthermore, a method for handling components is provided, in particular electronic components, which includes the following steps:

aspirating a component by vacuum pressure and holding the component via the vacuum pressure;

supporting the component held by vacuum pressure in the region of its surface acted upon by vacuum pressure, in such a way that this same surface, in particular the component, bends concavely when viewed from the side of the vacuum pressure.

In contrast to the related art, the component according to the invention is therefore essentially not held in a flat position by vacuum pressure, but in a concave position (viewed from the side of the vacuum pressure). As a consequence, the component is deformed in a manner that produces a convex form on the side opposite the substrate on which the component is mounted, in particular in the center of the surface of the component. To this extent the component is supported on the handling tool in several places, i.e., in particular in the center of the component from the side of the vacuum pressure, and toward the edge of the component, the support points lying at the edge of the component being located downstream from the suction direction, so that the mentioned bending of the component comes about. This ensures that the component first sets down on the substrate with the convex center area lying opposite the substrate, so that no shrink holes and/or extended shrink hole regions distributed across the entire surface of the component are able to form.

In one additional method variant, the placement of the component takes place at the edges of a holding opening to which a vacuum pressure is applied, the support being rendered upstream from the placement when viewed in the suction direction. The component thus is placed at a holding opening that may have a tubular, in particular cylindrical design, for example. Since vacuum pressure is applied to this holding opening, the component is retained at the holding opening with the aid of the vacuum pressure, support being provided upstream from the placement (viewed in the suction direction). This is accomplished in that the holding opening shifts in the suction direction (i.e., downstream), especially via a longitudinally variable support of the holding opening relative to a support point that retains the component in the center of the surface, as described in connection with the above described handling tool.

In a further, preferred development of the method, the magnitude of the vacuum pressure may be selected to be variable. This makes it possible to regulate the vacuum pressure that causes the component to be retained at the holding opening, and to adjust it to the nature and structure of the component, in particular. Furthermore, given a longitudinally displaceable placement of the holding points, especially the holding opening, it is also possible in this way to adjust the magnitude of the bending relative to the point of support within certain limits. In particular damage to the component by the bending is also able to be prevented in this manner.

DETAILED DESCRIPTION

Figure 1:
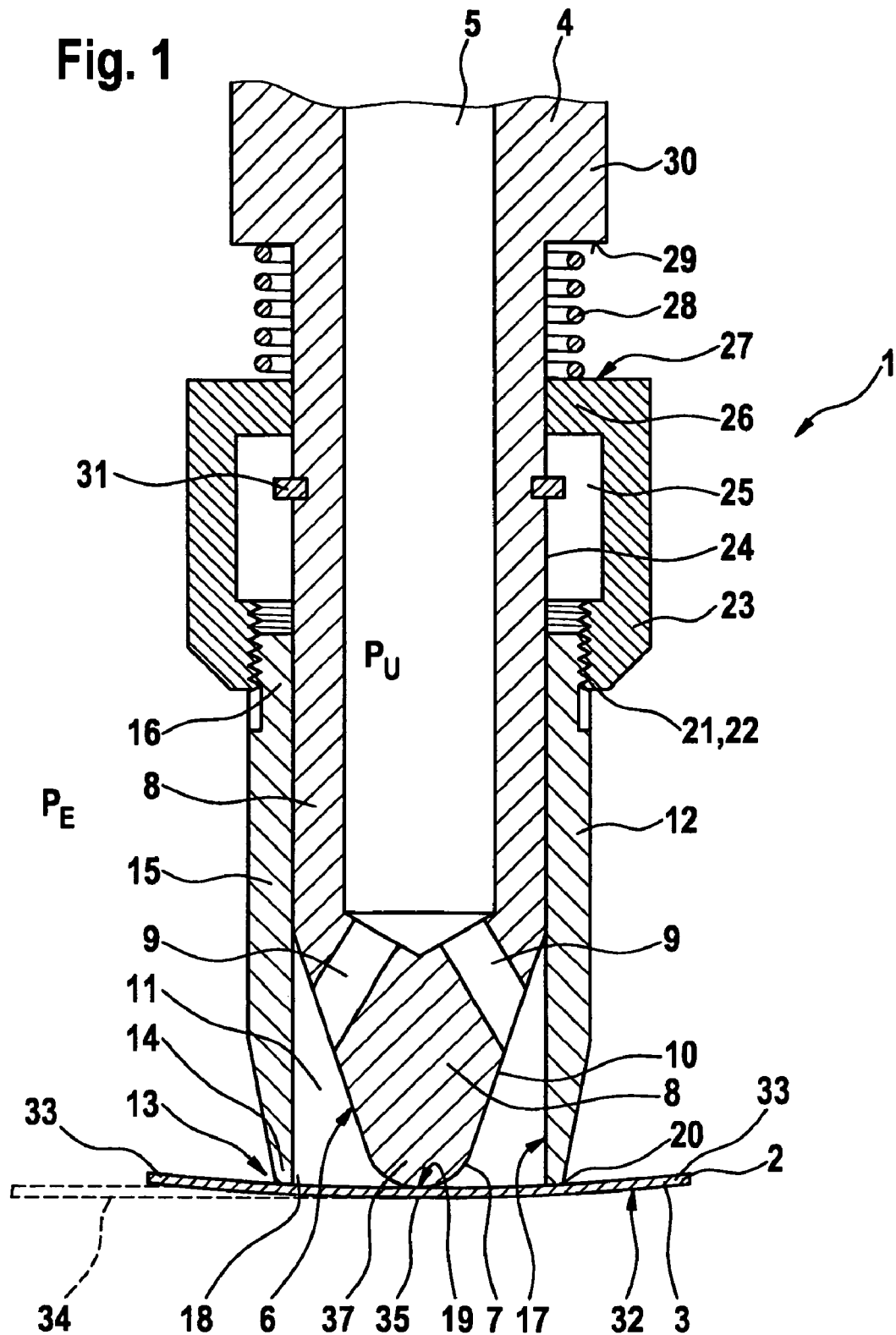
FIG. 1 shows a handling tool according to the present invention, in longitudinal section.

FIG. 1 shows a handling tool 1 for an electronic component 2, i.e., a chip 3. Handling tool 1 is made up of a vacuum pressure body 4, which has a cylindrical bore 5 that is connected to a vacuum pressure system (not shown). In its end region 6, vacuum pressure body 4 has a conical design 7 and thereby forms a counter support 8 for holding component 2. Conical design 7 has a rounded tip 37 in the region of the tip. Counter support 8 has two vacuum pressure supply channels 9, which go out from bore 5 of vacuum pressure body 4 and terminate at conical flanks 10 of counter support 8 on the outside, thereby connecting bore 5 to an aspiration region 11 surrounding the counter support. Counter support 8 is enclosed by an essentially cylindrical sleeve 12, which is disposed on counter support 8 in axially displaceable manner. At its front end region 13, the sleeve has tapered walls 14, so that its sleeve wall 15 has an increasingly weaker design in its end region 13 than in its rear region 16. End region 13 is the region that is spatially assigned to conical design 7 of counter support 8. In conjunction with conical design 7 (delimited by conical flank 10 of counter support 8), sleeve 12 via its end region 13, especially its inner walls 17, forms aspiration region 11 which, facing component 2, forms a holding opening 18 of handling tool 1. Holding opening 18 is circular in this instance because of the cylindrical development of sleeve 12. Counter support 8 is centrically positioned in holding opening 18 with its conical form 7, a conical tip 19 of counter support 8 projecting slightly toward the outside, i.e., projecting beyond an opening plane 20 formed by holding opening 18 toward the outside. The axial displaceability of sleeve 12 on counter support 8 is delimited by a travel-limiting sleeve 23, which is adjustable via a screw thread 21, in particular a fine thread 22. This travel-limiting sleeve 23 sits on fine thread 22 mounted on rear region 16 of sleeve 12 and is axially adjustable with respect to it, via fine thread 22. Travel-limiting sleeve 23 overlaps counter support 8 essentially in the form of a ring, and a regulation space 25 is formed between counter support 8 (i.e., its counter support outer wall 24) and travel-limiting sleeve 23. On one side, regulation space 25 is delimited by fine thread 22 adjacent to sleeve 12, and on the other side, in the region lying opposite of fine thread 22, by a guide ring 26 resting against counter support 8 or vacuum pressure body 4 in a manner permitting displacement by sliding. On the outside, i.e., on its top surface 27, guide ring 26 is supported on a spiral compression spring 28, which in turn is supported on a pressure retainer 29 of vacuum pressure body 4, which may be formed as circumferential enlargement 30 of cylindrical vacuum pressure body 4, for example. From here, the spring force is applied to sleeve 12 via travel-limiting sleeve 23 with the aid of spiral compression spring 28, so that in the rest state (i.e., when no component 2 is grabbed via vacuum pressure), sleeve 12 tends to maintain as much distance as possible from pressure retainer 29, the largest possible distance being specified by a limiting collar 31 in this case. The degree to which counter support 8 projects beyond holding opening 18 is able to be precisely adjusted via fine thread 22.

When a vacuum pressure $P_u$ is then applied to aspiration region 11 via bore 5 and vacuum supply channels 9, and when holding tool 1 is lowered onto component 2, holding opening 18 is sealed by component 2 as soon as contact is established. Vacuum pressure $P_u$ in aspiration region 11 builds up to the extent specified by the vacuum pressure application via bore 5, which causes sleeve 12 to slide axially in the direction of pressure retainer 29, counter to the spring force of spiral compression spring 28, and component 2 to be retained at holding opening 18 by ambient air pressure $P_E$, which exceeds vacuum pressure $P_u$ prevailing in bore 5 and thus in aspiration region 11. Ambient air pressure $P_E$ acting on component 2 causes it to deform while sleeve 12 experiences a slight further axial displacement such that, on its underside 32 facing the substrate (not shown here), component 2 undergoes a slight convex deformation, which is produced by conical tip 19 of counter support 8, which now projects slightly beyond opening plane 20 formed in holding opening 18, due to the now prevailing pressure ratios between ambient air pressure $P_E$ and vacuum pressure $P_U$. Because of the convex deformation of component 2, its edge regions 33 are raised from an original underside plane 34 of component 2, so that underside 32 of component 2 is no longer planar. This raising of edge regions 33 out of underside plane 34 occurs on all sides on component 2 as a result of the centrical placement of conical tip 19 of counter support 8 within holding opening 18; when component 2 is then placed on the substrate (not shown) via its underside 32, underside 32 first is lowered onto a protrusion 35 formed essentially centrically on component 2, so that possibly present gas inclusions are pushed away in the direction of edge regions 33. Therefore, when handling tool 1 releases component 2, i.e., when vacuum pressure $P_U$ is canceled, which is accompanied by a corresponding forward sliding of sleeve 12 due to the spring loading by spiral compression spring 28, and the repelling of component 2 from holding opening 18, component 2 is placed on the substrate from the inside (starting at protrusion 35) toward the outside (in the direction of edge regions 33). This makes it virtually completely impossible for air inclusions or shrink holes to occur.

Figure 2:
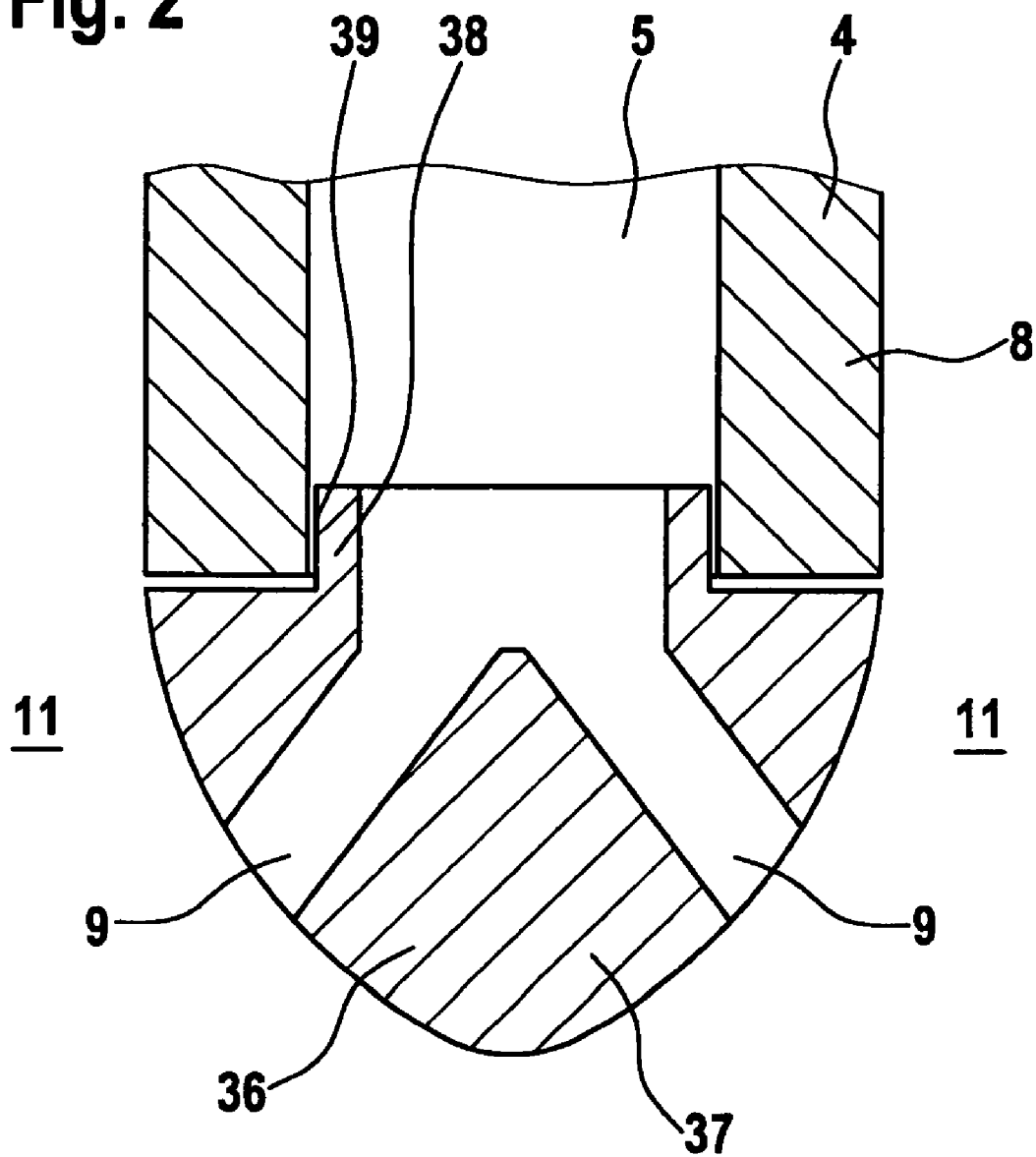
FIG. 2 shows an embodiment of the counter support having an exchangeable counter-pressure tip.

FIG. 2 shows a detail view of an example embodiment of counter support 8 from FIG. 1 having an exchangeable counter-pressure tip 36. The other components of handling tool 1 have not been illustrated for reasons of clarity. In this instance, rounded tip 37 is designed as exchangeable counter-pressure tip 36, which is introduced in bore 5 of counter support 8 or vacuum pressure body 4 with the aid of a suitable receptacle 38. Receptacle 38 is designed as plug-in receptacle 39 for this purpose, but a design in the form of a screw joint or a similar suitable affixation is conceivable as well. Counter-pressure tip 36 has vacuum pressure supply channels 9, which like in the previously described FIG. 1, are developed as regional penetrations of the body of counter-pressure tip 36 and permit a pressure communication between bore 5 of counter support 8 and aspiration region 11 surrounding the counter-pressure tip. Exchangeable counter-pressure tip 36 may have different geometries or material characteristics in order to satisfy the special requirements of even highly sensitive components of all kinds. Furthermore, an uncomplicated and inexpensive exchange of exchangeable counter-pressure tip 36 is possible when wear or damage has occurred, without the need to exchange entire handling tool 1 or at least vacuum pressure body 4. As a result, it is able to be used for a wide variety of applications and for a multitude of even the most sensitive components; furthermore, handling tool 1 is very easy to service and thus provides considerable cost savings.

Figure 3:
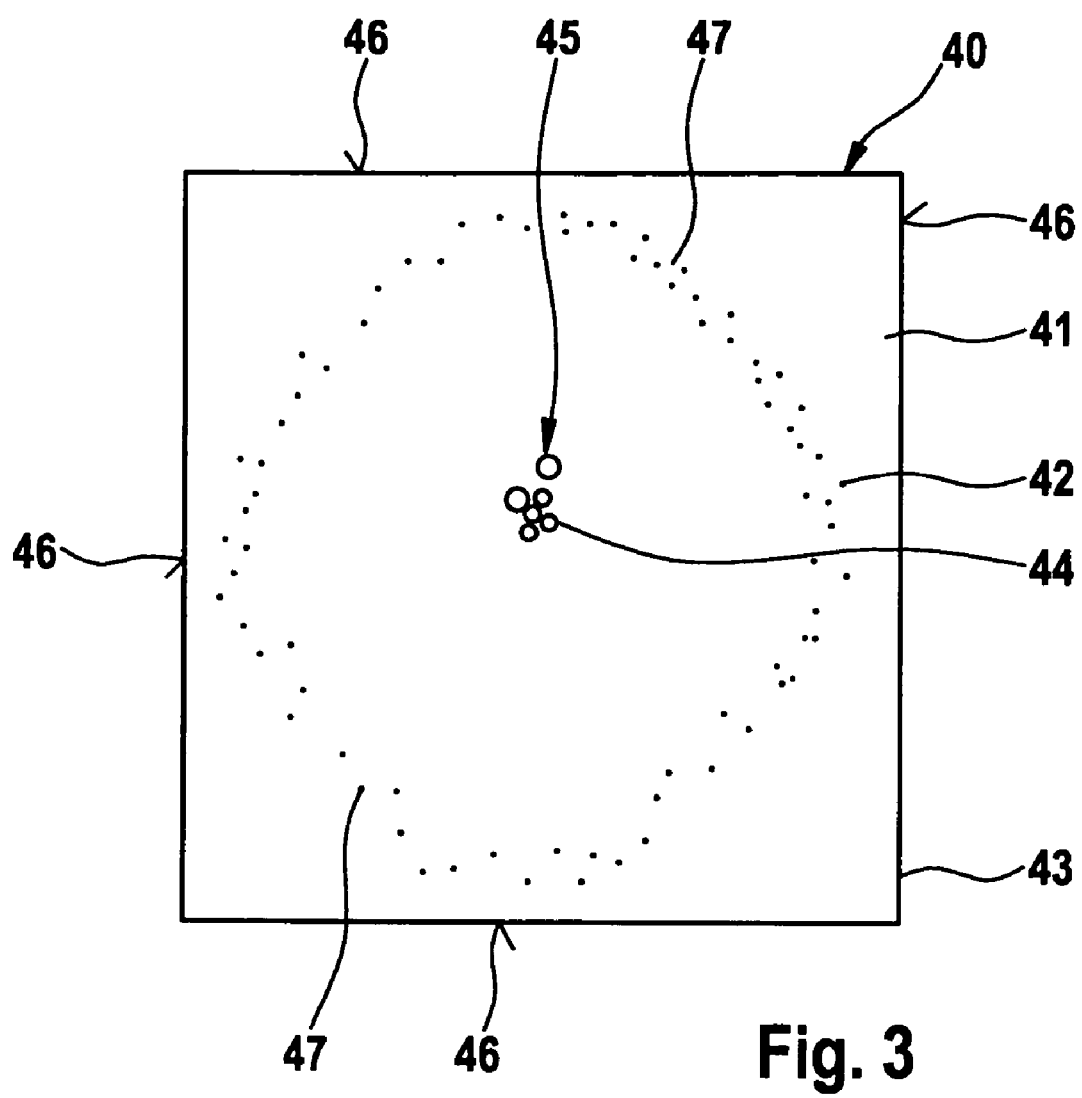
FIG. 3 shows a characteristic improved array of residual shrink holes when using the handling tool according to the present invention.

FIG. 3 shows an enlarged, simplified view of a section 40 of a surface 41 of a substrate 42, on which component 2 (not shown here), in particular a chip 3 (also not shown), has been mounted. On surface 41 of substrate 42, in the center of an area 43 that corresponds to the dimensions of component 2 (not shown here), there are individual residual shrink holes 44 (illustrated in highly exaggerated form), which jointly form an extended shrink hole region 45. When using handling tool 1 (not shown here) according to the present invention, shrink hole region 45 invariably forms in this or in a similar way in the center of area 43, which is due to the use of counter support 8 (not shown here), in particular conical tip 19 (likewise not shown) and/or exchangeable counter-pressure tip 36 (also not shown here, cf. FIG. 1 and FIG. 2 in this context). The shrink hole development in the center of area 43 occurs because component 2 (not shown) first makes contact with substrate 42 in this location. Gas, which could cause additional shrink holes and/or additional inclusions in substrate 42 as soon as component 2 is placed thereon, is able to escape toward the outer edge regions 46 of the surface when using handling tool 1 according to the present invention, so that an inclusion and thus a development of residual shrink holes 44 in regions close to outer edge regions 46 or in large areas on surface 43 does not occur. A few additional small residual shrink holes 44 may develop despite the use of handling tool 1 according to the present invention, whose geometry reflects the geometry of end region 13 of sleeve 12 (not shown here). In the process, a ring of shrink holes 47 develops (shown here for a circular geometry of sleeve 12 in heavily exaggerated form), in which a few shrink holes are produced in a pattern that corresponds to the sleeve geometry. The term ring of shrink holes 47 denotes any geometric design of individual residual shrink holes 44 that corresponds to the geometry of the used sleeve 12 (not shown here) of handling tool 1 (not shown here). As a consequence, there always results a pattern of residual shrink holes 44 that is characteristic for handling tool 1 (not shown here) or for the use of the method according to the present invention. The pattern of the individual residual shrink holes 44 invariably corresponds to the geometries that are found in handling tool 1 (not shown), i.e., especially sleeve 12, for a possible ring of shrink holes 47, or counter support 8 (in particular exchangeable counter-pressure tip 36 or conical tip 19; cf. FIG. 1 and FIG. 2). When such a characteristic development of residual shrink holes 44 shows up, it always points to the use of handling tool 1 according to the present invention or the method for handling components according to the present invention. For in contrast to the shrink hole development found in the related art, the shrink hole developments encountered here (to a very slight extent) have a specific geometry. They do not follow a random distribution pattern and are especially not distributed across area 43 in essentially uniform manner. Instead, an accumulation of residual shrink holes 44 in area 43 is found only in places where pressure is exerted by handling tool 1 according to the present invention, i.e., in the region of sleeve 12 (forming a ring of shrink holes 47), or counter support 8 and/or conical tip 19 or exchangeable counter-pressure tip 36, by the development of a shrink hole region 45 on surface 43 in essentially centrical form.

What is claimed is:

1. A handling tool for handling a component, comprising:
  a holding opening defined by an opening of a sleeve, wherein a vacuum pressure is applied to the holding opening to hold the component via vacuum pressure; and
  at least one counter support situated substantially concentrically inside the holding opening, wherein the sleeve is configured to move independently of the at least one counter support, causing the at least one counter support to outwardly project beyond the plane of the holding opening in an operating position.

2. The handling tool as recited in claim 1, wherein the sleeve is supported on the counter support in an axially displaceable manner.

3. The handling tool as recited in claim 2, wherein the sleeve is axially displaceable counter to a spring force.

4. The handling tool as recited in claim 2, wherein the vacuum pressure is selectively controlled by a control device as a function of the component.

5. The handling tool as recited in claim 2, wherein the counter support is penetrated by at least one vacuum pressure supply channel.

6. The handling tool as recited in claim 2, wherein the counter support is centrally situated in the holding opening.

7. The handling tool as recited in claim 2, wherein the counter support has a conical tip.

8. The handling tool as recited in claim 7, wherein the conical tip is an exchangeable counter-pressure tip configured to be selectively detached and reattached to the counter support.

9. A method for handling a component, comprising:
  aspirating a component by a vacuum pressure and holding the component by the vacuum pressure at a holding opening of a holding tool, the holding opening defined by an opening of a sleeve; and
  supporting the component held by vacuum pressure in a region of a surface of the component acted upon by the vacuum pressure, whereby at least a portion of the surface of the component acted upon by the vacuum pressure bends concavely when viewed from the side of the vacuum pressure; wherein:
    the component is held by the vacuum pressure at the edge of the holding opening; and
    the supporting of the component is provided by a counter support element at a substantially concentric center of the holding opening; and
  in response to a force applied by the component being held, moving the sleeve independently of the counter support element, to cause the at least one counter support to outwardly project beyond the plane of the holding opening in an operating position.

10. The method as recited in claim 9, wherein the magnitude of the vacuum pressure is selectively varied depending on the force applied by the component.

* * * * *